(12) United States Patent
Wu (10) Patent No.: US 12,273,668 B2
(45) Date of Patent: Apr. 8, 2025

(54) MULTI-DIE NON-BLOCKING CROSSBAR SWITCH

(71) Applicant: XILINX, INC., San Jose, CA (US)

(72) Inventor: Ephrem Wu, San Mateo, CA (US)

(73) Assignee: XILINX, INC., San Jose, CA (US)

( * ) Notice: Subject to any disclaimer, the term of this patent is extended or adjusted under 35 U.S.C. 154(b) by 240 days.

(21) Appl. No.: 18/081,466

(22) Filed: Dec. 14, 2022

(65) Prior Publication Data

US 2024/0205570 A1 Jun. 20, 2024

(51) Int. Cl.
*H04Q 3/00* (2006.01)
*H04Q 3/52* (2006.01)
*H04Q 3/60* (2006.01)

(52) U.S. Cl.
CPC ............ *H04Q 3/0004* (2013.01); *H04Q 3/521* (2013.01); *H04Q 3/602* (2013.01)

(58) Field of Classification Search
CPC ....... H04Q 3/0004; H04Q 3/521; H04Q 3/602
USPC .......................... 379/272, 242, 258, 268, 271
See application file for complete search history.

(56) References Cited

U.S. PATENT DOCUMENTS

| 7,107,386 | B1 | 9/2006 | Purcell et al. |
| 2018/0189642 | A1* | 7/2018 | Boesch ................ G06N 3/047 |

FOREIGN PATENT DOCUMENTS

EP 3208981 A2 8/2017

OTHER PUBLICATIONS

International Search Report and Written Opinion from PCT/US2023/034208 dated Jan. 31, 2024.

* cited by examiner

*Primary Examiner* — Thjuan K Addy
(74) *Attorney, Agent, or Firm* — Patterson + Sheridan, LLP (57) ABSTRACT

A non-blocking crossbar switch architecture circumvents the problem present in prior art crossbar switches where input signals may oversubscribe the available inter-die bandwidth. The new non-blocking crossbar switch architecture is split across a plurality of semiconductor dice, including a plurality of interleaved crossbar switch segments. Only one crossbar switch segment is implemented on each semiconductor die. A plurality of input ports and output ports are coupled to the crossbar switch. The crossbar switch is non-blocking, i.e., any one output port not currently receiving data may receive data from any one input port.

20 Claims, 5 Drawing Sheets

MULTI-DIE NON-BLOCKING CROSSBAR SWITCH

TECHNICAL FIELD

Examples of the present disclosure generally relate to crossbar switches in packaged devices, and, in particular, to a multi-die non-blocking crossbar switch.

BACKGROUND

Crossbar switches implemented across multiple semiconductor dice in a packaged device can overwhelm the inter-die interconnects. These crossbar switches are not the slow-to-configure interconnects on field gate programmable gate arrays (FPGAs). Rather, the crossbar switches support connectivity changes for all ports of one or more semiconductor dies in every clock cycle, typically hundreds of megahertz (MHz). Prior techniques generally split a switch among the semiconductor dice in the package. In crossbar switches that include a non-blocking property, the received signals on each semiconductor die are broadcast to all other semiconductor dice. However, broadcasting the input signals typically oversubscribes the available inter-die bandwidth.

SUMMARY

These and other examples may be understood with reference to the following detailed description.

A non-blocking crossbar switch architecture is disclosed that circumvents the problem present in prior art crossbar switches where input signals may oversubscribe the available inter-die bandwidth. The new non-blocking crossbar switch architecture is split across a plurality of semiconductor dice, including a plurality of interleaved crossbar switch segments. Only one crossbar switch segment is implemented on each semiconductor die. A plurality of input ports and output ports are coupled to the crossbar switch. The crossbar switch is non-blocking, i.e. any one output port not currently receiving data may receive data from any one input port.

In one example, a crossbar switch system is provided that includes a plurality of semiconductor dice, one or more data interleavers coupled to a crossbar switch, one or more data de-interleavers coupled to the crossbar switch, a plurality of interleaved crossbar switch segments. Each data interleaver of the one or more data interleavers includes a plurality of input ports. Each data de-interleaver of the one or more data de-interleavers also includes a plurality of output ports. One crossbar switch segment of the plurality of interleaved crossbar switch segments is implemented on one semiconductor die of the plurality of semiconductor dice. Any one output port of the plurality of output ports is configured to receive data from any one input port.

In another example, a crossbar switch system is provided that includes one or more data de-interleavers, an integrated circuit device, and one or more data interleavers. The one or more data de-interleavers are configured to receive data from a crossbar switch. The integrated circuit device are coupled to the one or more data de-interleavers. The one or more data interleavers are coupled to the integrated circuit device. The one or more data interleavers are configured to transmit data to the crossbar switch.

In yet another example, a method for implementing a crossbar switch is provided. The method includes providing one or more device packages; providing a plurality of semiconductor dice; providing one or more data interleavers coupled to a crossbar switch, wherein each data interleaver of the one or more data interleavers includes a plurality of input ports; providing one or more data de-interleavers coupled to the crossbar switch, wherein each data de-interleaver of the one or more data de-interleavers includes a plurality of output ports; and providing a plurality of interleaved crossbar switch segments, wherein one crossbar switch segment of the plurality of interleaved crossbar switch segments is implemented on one semiconductor die of the plurality of semiconductor dice, wherein no data connections are configured between the semiconductor dice, and wherein any one output port is configured to receive data from any one input port.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Disclosed here is a new non-blocking crossbar switch system that avoids the inter-die bandwidth bottleneck and makes feasible the implementation of large non-blocking crossbar switches, beyond the throughput of prior art techniques. The prior art switches today typically have 128 serial transceivers at over 100 Gb/s per transceiver. As is described in greater detail in the following, a non-blocking crossbar switch is split over multiple semiconductor dice, improving manufacturing yields and reducing corresponding costs. For example, the transceivers of the non-blocking crossbar switch are split across multiple semiconductor dice. A multi-die implementation also enables per-die power binning to ensure optimal power consumption of the packaged device. In one or more examples, a multi-die implementation of a non-block crossbar switch may be used in networking application, in which line cards communicate with one another at Tb/s rates. In other examples, a multi-die implementation of a non-block crossbar switch may be used in neural-network training, in which multiple accelerator devices (such as graphic processing units (GPUs) and application specific integrated controllers (ASICs)) interchange training results in a non-blocking fashion such that the accelerators appear as one large training computing device.

Advantages of the disclosed system over prior techniques include:
1. Scalable non-blocking switching with throughput that exceeds prior techniques.
2. Reduced cost due to improved yields.
3. Ability to control maximum power consumption using power binning.
4. Appears as a large monolithic switch to applications.

In one or more examples, if a crossbar switch with N input ports and M output ports (an N×M crossbar switch) is non-blocking, any idle output port, an output port which is not receiving any useful data, can receive useful data from any one of the N input ports. Such a crossbar switch is non-blocking because it is a set of M instances of an N-to-1 multiplexer, which itself is non-blocking. Consider a multiplexer with N input ports, each input port being a W-bit bus operating at a clock frequency F. This multiplexer has at least $[\log_2 N]$ address signals for the output port to receive data from one of the N input ports. A multiplexer could use sparse encoding for the address and have up to N address signals, one for each input. Such a multiplexer is sometimes called a selector. Using the bracket notation to specify a closed interval, the number of address signals for a multiplexer is $[\log_2 N, N]$.

The entire crossbar switch has three types of interfaces: input, output, and address. Table 1 captures the number of wires and bandwidth of each interface.

TABLE 1

| Interface | Number of Wires | Bandwidth (Bits per Cycle) |
| --- | --- | --- |
| Input | NW | NWF |
| Output | MW | MWF |
| Address | $[M[\log_2 N], MN]$ | $[M[\log_2 N], F, MNF]$ |

As an example, consider a 128×128 crossbar switch, each input port being a 128 Gb/s serial receiver and each output port being a 128 Gb/s serial transmitter. The crossbar switch does not operate in the serial domain but instead operates with a 500 MHz clock in the parallel domain, that is, the switch connectivity can change every 500 MHz clock cycle. Therefore, the crossbar switch bus width is 128 Gb/s÷500 MHZ=256 bits. A 1-to-256 de-serializer between each serial receiver and the corresponding crossbar switch input port and a 256-to-1 serializer between each crossbar switch output port and the corresponding serial transmitter serve as data-width adapters between the serial and the parallel domains.

Table 2 summarizes the number of wires and bandwidth for each interface in the parallel domain. For the address interface, dense encoding is assumed.

TABLE 2

| Interface | Number of Wires | Bandwidth (Bits per Cycle) |
| --- | --- | --- |
| Input | 32,768 | 16,384 Gb/s |
| Output | 32,768 | 16,384 Gb/s |
| Address | 896 | 448 Gb/s |

In prior art devices, such a crossbar switch on a two-die semiconductor device may be configured where each semiconductor die holds half of the input and output interfaces. Serial receivers 0 to 63 and serial transmitters 0 to 63 reside in the first die and serial receivers 64 to 127 and serial transmitters 63 to 127 in the second die. The current crossbar switch solutions split this crossbar switch into two halves, one on each die. Each half switch implements half the outputs but receives all the inputs to preserve the non-blocking property. Specifically, each half switch is an N×M/2 crossbar switch, receiving half of its input from the same die and the other half from the other die.

Today's advanced multi-die devices generally have no more than 18,000 wires between two semiconductor dice, although each die can have 64 serial transceivers (transmitters and receivers). A prior art crossbar architecture, in a two die device such as shown in Table 2, may use 32,768 inter-die wires, half of which go from Die 1 to Die 2, and the other half from Die 2 to Die 1. This results in oversubscribing, i.e. a situation where an insufficient number of inter-die wires are available. Although serializing inter-die signals, for example, by doubling the inter-die interface clock to 1 GHZ, theoretically doubles the available inter-die bandwidth, a 500 MHz clock cycle in the parallel domain is a practical limit, particularly for multi-die devices that use passive silicon interposers to implement inter-die connections.

The new crossbar switch architecture disclosed here comprises a large non-blocking crossbar switch configured across multiple semiconductor dice in a package to reduce silicon cost without oversubscribing inter-die interfaces while still preserving the non-blocking property.

The disclosure suggests a way to maintain the package pin-out of an existing monolithic crossbar switch.

The disclosure includes standalone interleaving devices to support legacy agents (devices exchanging data through the switch).

The disclosure illustrates that add-on devices for data interleaving can be fused into the agent semiconductor dice or be on separate semiconductor dice in a device package. It further suggests the use of FPGA dice with programmable logic and transceivers to support different degrees of data interleaving.

A multi-die implementation can support higher aggregate switching bandwidth than a monolithic implementation because the multi-die device has more silicon area. For instance, a multi-die 192×192×256 switch may cost the same as a monolithic 128×128×256 switch but has 50% more aggregate bandwidth. Scaling to higher aggregate switch bandwidth using multiple multi-die switching devices is possible.

Figure 1:
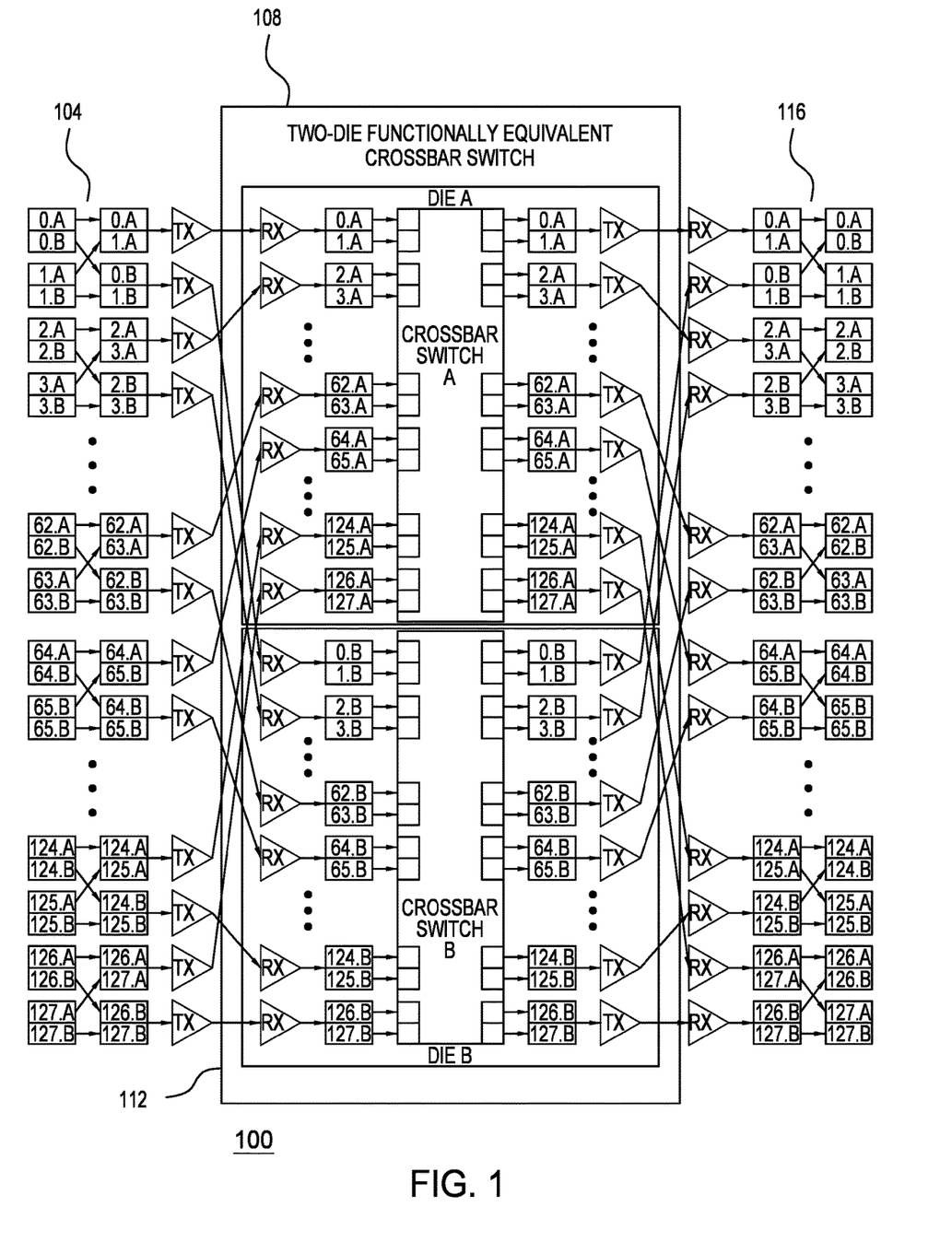
FIG. 1 illustrates an example, according to one example of a Two-Dice, Two-Way Interleaved Crossbar Switch.

FIG. 1 illustrates an example, according to one example of a Two-Die, Two-Way Interleaved Crossbar Switch 100.

A crossbar switch is a set of multiplexers. The bandwidth problem in prior art crossbar switches results from each multiplexer having to receive at least half of its input data from inter-die interfaces. Specifically, when a switch is distributed across Q dice, each multiplexer receives Q−1/Q of its inputs from inter-die interfaces. The architecture disclosed moves these inter-die connections from inter-die interfaces to the package or the board to preserve the non-blocking property and lower the cost of the switch.

The preferred embodiment distributes an N×M crossbar switch with W-bit data buses evenly across Q dice such that each die implements an N×M/Q crossbar switch with W/Q-bit data buses. All Q switches operate in parallel using the same connectivity, but switching 1/Q of the total bandwidth T. This switch is called a Q-way interleaved crossbar switch. Each of the Q switches can also be described as a crossbar switch segment. For simplicity, a N×M crossbar switch with W-bit data busses is written as an N×M×W crossbar switch.

FIG. 1 illustrates a monolithic N×M×W=128×128×256 crossbar switch 100 on Q=2 dice (i.e. two crossbar switch segments) as two, two-way interleaved crossbar switch segments 108,112 on two dice A,B each of which constitutes an N×M×W/Q=128×128×128 crossbar switch. Each crossbar switch segment 108,112 is implemented on only one semiconductor die. In this example, Each Die A and Die B block represents 128 bits of data. The chip packages and their pins are visible in the illustrations of Die A and Die B.

In column 104 are illustrated the data interleaver input pairs (for example, 0.A and 0.B) that are inputs to the crossbar switch transmitters that are switched to the output pairs coupled to the crossbar switch receivers in column 116.

Figure 2:
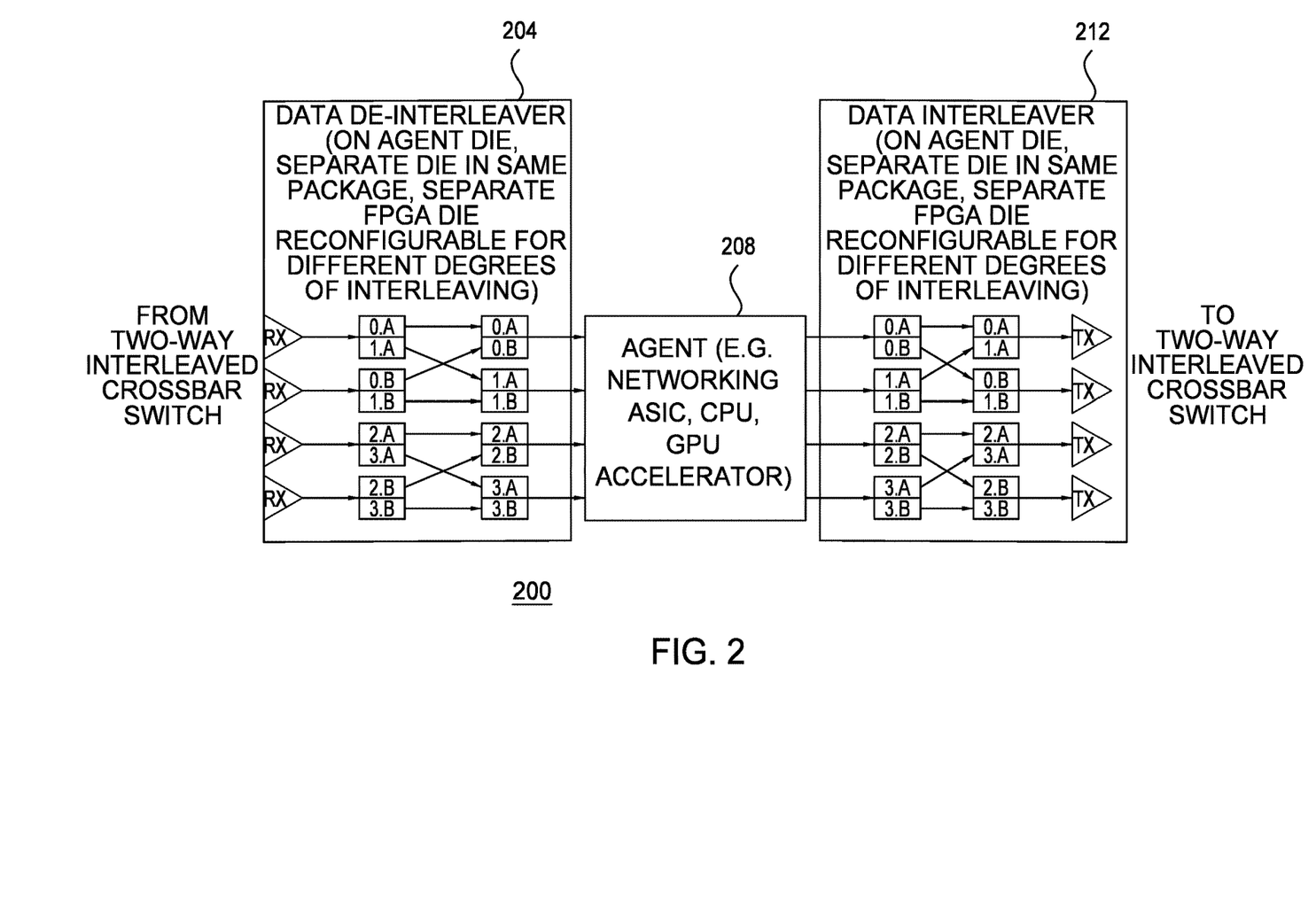
FIG. 2 illustrates an example, according to one example, of an Agent Supporting Two-Way Data Interleaving.

Column 104 represents an example of a group of two-way data interleavers (i.e. where Q=2) that receive data from various agents (FIG. 2, 208). A "group" of data interleavers may comprise one or more data interleavers. Each two-way data interleaver in column 104 splits the data from each input port into two halves, so it is referred to as a two-way interleaver. Each two-way data interleaver supports two parallel crossbar switches 108,112, thus Q=2. The smallest data interleaver includes two input ports, where each input port has two halves. For example, the data from port 1 has two halves, labeled "1.A" and "1.B." Data from "1.A" goes to the first transmitter and enters the first port of crossbar switch A 108. The other half of the data from port 1, namely "1.B", goes to the second transmitter and enters the first port of crossbar switch B 112.

Column 116 represents an example of a group of two-way data de-interleavers (i.e. where Q=2) that transmit data to various agents (FIG. 2, 208). A "group" of data de-interleavers may comprise one or more two-way data de-interleavers. The configuration of each two-way data de-interleaver in column 116 mirrors the configuration of the data interleavers in column 104, except that the data is being received by each data de-interleaver instead of being transmitted.

The Data bus has been split into a top half and bottom half, i.e. the lower 128 bits and the upper 128 bits. Each bus is being switched in a different die, using exactly the same control lines. In this example, each data de-interleaver in column 116 has four input ports labeled Rx, and each data interleaver in column 104 has four output ports labeled Tx.

No data wires or data connections go across the inter-die interface between the interleaved crossbar switch, but the transceiver routing is different. This change in transceiver signal routing can occur:

1. in the package routing between the pins of the package and on the bumps on the dice if the interleaved switch package pin-out remains the same as the monolithic implementation, or
2. on the board if pin compatibility with another switch is not a requirement.

To avoid using inter-die interconnects, this disclosure divides a W-bit data word destined for a switch port into Q equal parts, each part for one of the Q interleaved switches. For Q=2, FIG. 1 labels each half of a data word for port P in the form P. X, where X is the letter "A" or "B." The first half of the data word (bits 0 to W/2–1, that is, 0 to 127) is labeled "A" in a box. The second half of the data word (bits 128 to 255) is labeled "B" in a different box.

FIG. 1 uses 2-way data interleaving. The objective of this data interleaving is to move all part A traffic to one die ("Die A") and all part B traffic to another die ("Die B"). This interleaving enables the two identical 2-way interleaved crossbar switch segments to switch only half the bandwidth (but still with the same number of ports, that is, the switch is still N×M. Each interleaved switch is still a fully non-blocking N×M switch, except it's only switching half the traffic in it's half of the bus, not half the inputs.

Data interleaving on switch ingress and de-interleaving on switch egress occurs outside of the crossbar switch package. The data interleaving pattern repeats every Q=2 switch ports. For port P, the ([P·A, P·B], [(P+1)·A, (P+1)·B]>data pattern for the monolithic switch becomes ([P·A, (P+1)·A], [P·B, (P+1)·B]), where the two half-data words in the square brackets are destined to the same transceiver. Unlike a monolithic switch, in this design only data words destined to the same switch die are serialized and deserialized together.

FIG. 2 illustrates an example, according to one example, of an Agent Supporting Two-Way Data Interleaving. FIG. 2 represents a data de-interleaver interleaver system 200 that allows an "agent" to communicate with the interleaved crossbar switch of FIG. 1.

In this scheme, the data de-interleaver 204 and data interleaver 212 might be added to an existing device or "agent" to allow the agent to communicate with crossbar switches. In this example, the data de-interleaver 204 has four input ports labeled Rx, and the data interleaver has four output ports labeled Tx.

The data interleavers and de-interleavers are used to connect conventional agents (e.g., CPUs, GPUs, etc.) to interleaved switches.

In one or more examples, the data de-interleaver 204 and data interleaver 212 may use cooperation from external devices, i.e. agents 208. Consider 32 agents 208, such as networking line card ASICs, GPUs, CPUs, or machine-learning accelerators, connected to a 128×128×256 two-way interleaved non-blocking crossbar switch. Each agent contributes 128/32=4 ports' worth of traffic to the switch in both directions. The output of each agent 208 (connected to the switch ingress) interleaves outgoing traffic. Likewise, the input of each agent 208 (connected to the switch egress) de-interleaves incoming traffic.

A device that supports two-way interleaving has an even number of ports. Data de-interleaver interleaver system 200 has four input ports and four output ports, providing an even number of ports. In general, a device that supports Q-way interleaving has a multiple of Q ports.

Figure 3:
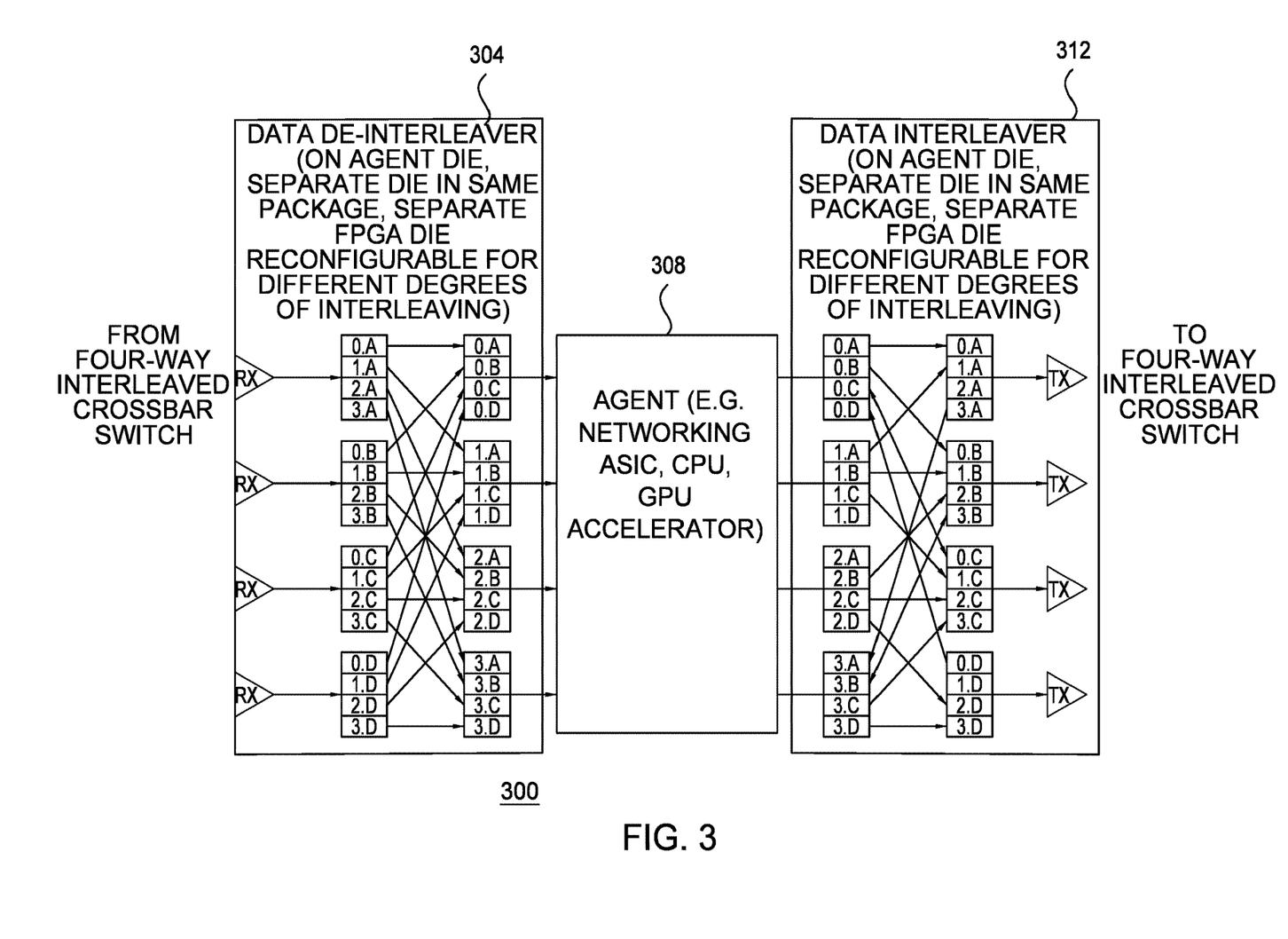
FIG. 3 illustrates an example, according to one example, of an Agent Supporting Four-Way Data Interleaving

FIG. 3 illustrates an example, according to one example, of an Agent Supporting Four-Way Data Interleaving.

Earlier examples in this disclosure describe a two-way interleaved switch (Q=2). The degree of interleaving can be any positive integer. FIG. 3 illustrates a four-way data interleaver system 300 (Q=4), i.e. four crossbar switch segments. The four-way data interleaver 300 has four input ports and four output ports, which is the minimum number of ports for 4-way interleaving.

The data de-interleaver 304 and data interleaver 312 are configured for cooperation with external devices, i.e. agents 308. External agents 308 in some examples might be networking line card ASICs, GPUs, CPUs, or machine-learning accelerators, connected to a four-way interleaved non-blocking crossbar switch. Each agent contributes 128/32=4 ports' worth of traffic to the switch in both directions. The output of each agent 308 (connected to the switch ingress) interleaves outgoing traffic. Likewise, the input of each agent 308 (connected to the switch egress) de-interleaves incoming traffic.

The boxes around the data interleaver FIG. 3, 312 and the data de-interleaver FIG. 3, 304 indicate that they can be in the same device package as the agent die in one example, or they can be in separate device packages and placed on the board between the interleaved crossbar switch and the traditional agent chips in another example. Specifically, FIG. 3, 304,312 (with the same number of groups of interleavers AND de-interleavers) could be packaged in one chip. The former is preferred since it takes less energy to move data within the package than to add transceivers (half on the agent chip and half on the interleavers and de-interleaver chips) to drive electrons through printed circuit board traces.

Examples in this disclosure focus on avoiding all inter-die data communication. Creating a hybrid switch with some legacy un-interleaved input ports is possible. The legacy input ports use the inter-die interconnects to broadcast data to all other interleaved switches. The output remains interleaved and needs external devices for de-interleaving. (The legacy input ports can send traffic to any output ports. Note the plural for multicasting. De-interleaving egress traffic is prohibitively expensive and defeats the purpose of this disclosure.) In one or more examples, limiting the number of the legacy input ports ensures that the corresponding data does not overwhelm the inter-die interfaces.

Figure 4:
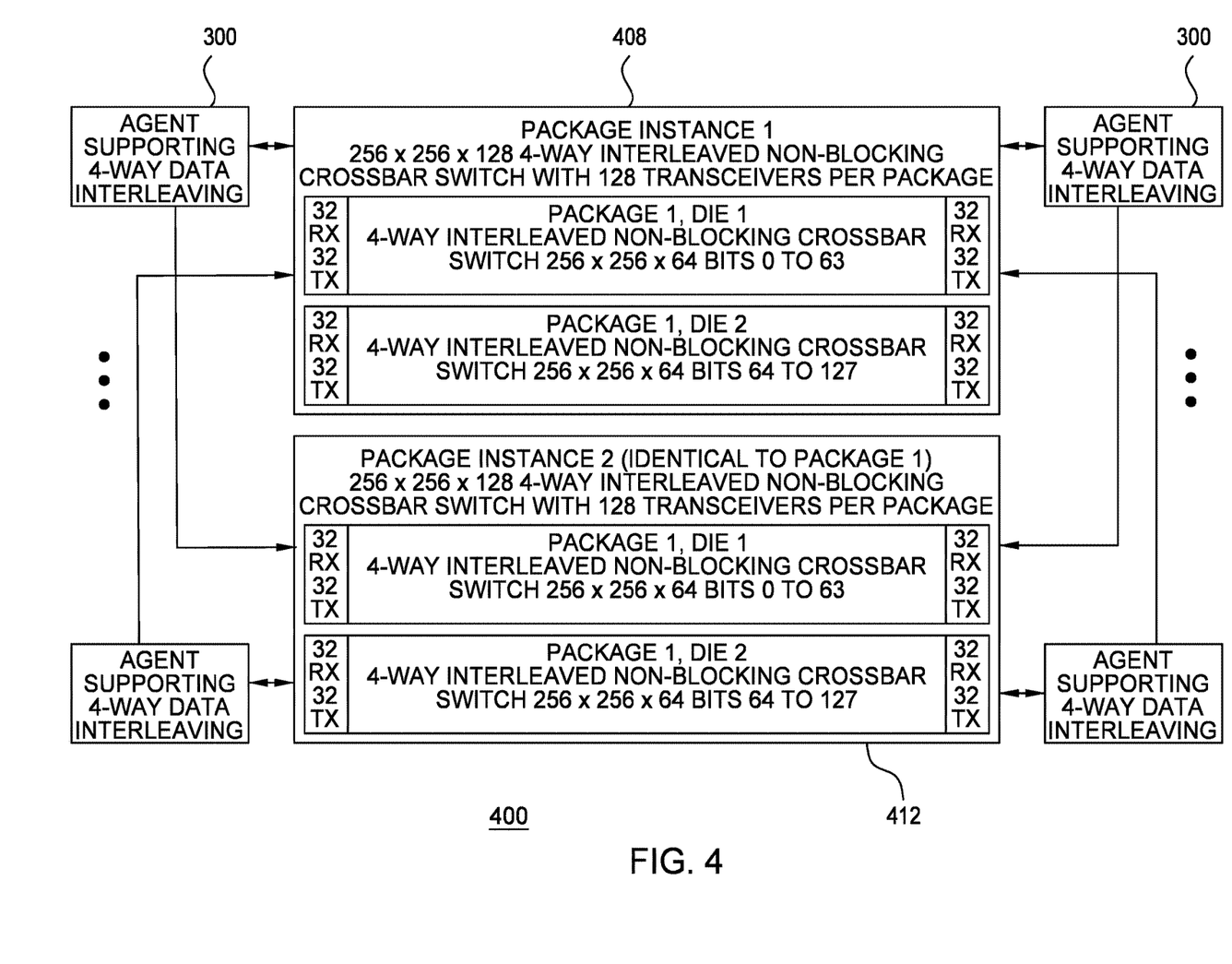
FIG. 4 illustrates an example, according to one example, of Two Two-Dice Four-Way Interleaved Switches Implementing a 256×256×256 Non-Blocking Switch.

FIG. 4 illustrates an example, according to one example, of Two Two-Dice Four-Way Interleaved Switches 408,412 implementing a 256×256×256 Non-Blocking Switch. The crossbar scheme 400 demonstrates four crossbar switch segments implemented on a total of four semiconductor dice and a total of two device packages, with two semiconductor dice implemented on each package.

Several agents 300 supporting 4-way data interleaving are illustrated. These agents 300 communicate with several interleaved non-blocking crossbar switch packages 408, 412. Each crossbar switch package 408, 412 may comprise multiple semiconductor dice. The example in FIG. 4 illustrates how splitting a crossbar switch does not have to occur completely inside one package, it can occur across multiple packages.

FIG. 4, no. 300 is the entire FIG. 3, which includes data interleaving for data going from the agent to the switch, and data de-interleaving for data going from the switch to the agent. The agent here represents a traditional (non-interleaved) logical entity that communicates with other agents via a crossbar switch. In one example, as the crossbar switch here is interleaved, data interleavers 312 and data de-interleavers 304 are tagged to make the traditional agent and the (new) interleaved crossbar switch compatible.

Figure 5:
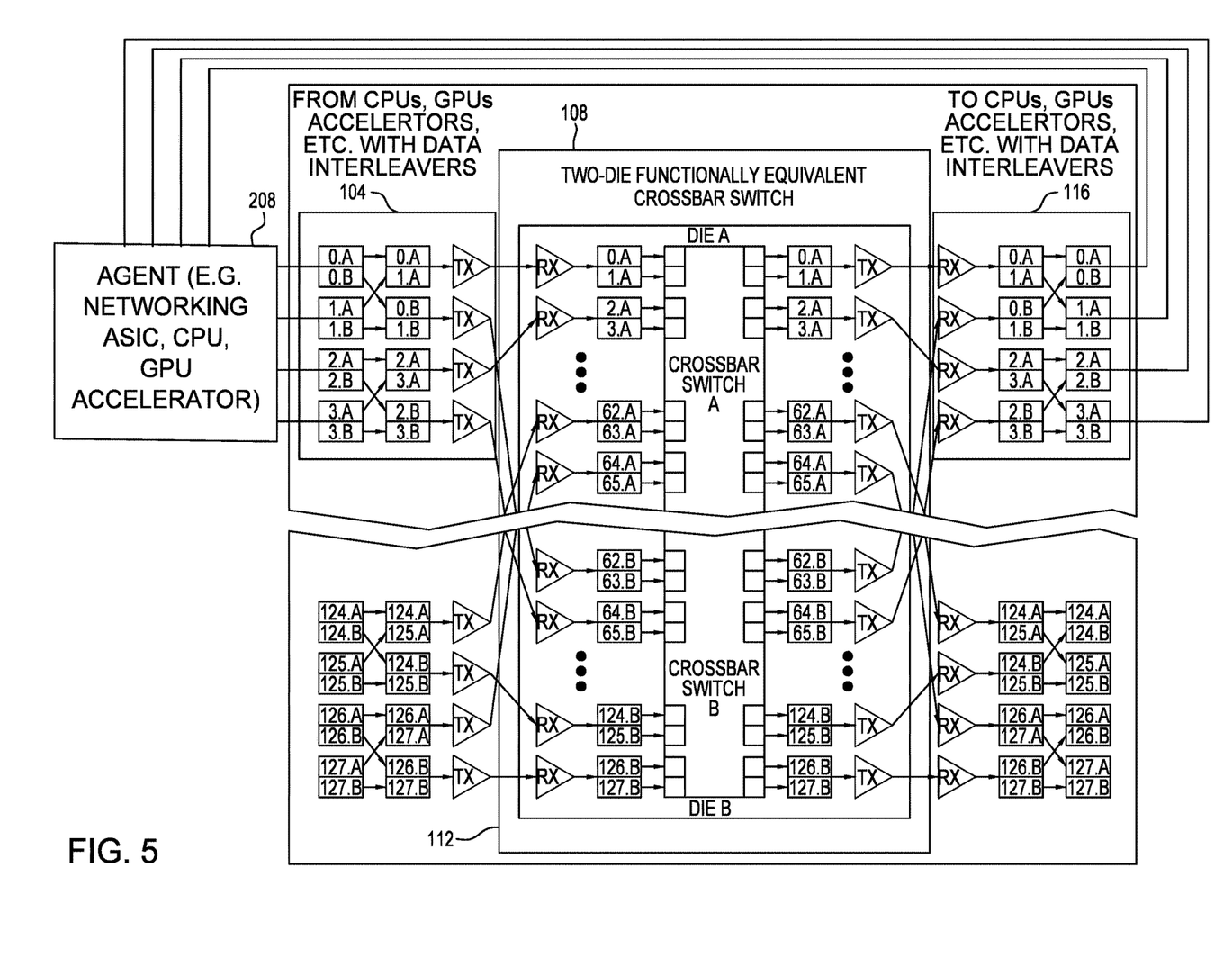
FIG. 5 illustrates an example, according to one example, of an Agent to Multi-Dice Crossbar Switch Logical Wiring Diagram.

FIG. 5 illustrates an example, according to one example, of an Agent to Multi-Die Crossbar Switch Logical Wiring Diagram. FIG. 5 is a logical wiring diagram, and not necessarily an actual layout.

Traditional intercommunicating agents (e.g. networking ASICs, CPUs, GPUS, accelerators) do not interleave outgoing data (destined for the switch) and do not interleave incoming data (from a crossbar switch). Data interleavers 212 and de-interleavers 204 may be packaged components inserted between an interleaved switch and traditional agents 208. To reduce the power consumed by these additional links on a circuit board (i.e. data moving from 208 to 212 and from 204 to 208), the data interleavers and data de-interleavers may be on the same silicon as the agent. In other words, the traditional agent 208, one or more data interleavers 212 and one or more data de-interleavers 204 may be on the same die to reduce power consumption.

Alternatively, an existing agent die may be in one device package, i.e. the same device package with one or more data interleavers and de-interleavers connected through 1) a package substrate as a multi-chip module or 2) a passive silicon interposer on which the traditional agent die and the data interleavers and de-interleavers reside. As yet another alternative, an active silicon interposer that includes the data interleavers and de-interleavers may communicate with a traditional agent die on top of the active interposer.

FIG. 5 represents a data de-interleaver interleaver system that allows an "agent" to communicate with the interleaved crossbar switch of FIG. 5. The agents 208 are the external components. Multiple agents 208 communicate with each other through the interleaved switches.

In this scheme, the data de-interleaver 204 and data interleaver 212 might be added to an existing device or "agent" to allow the agent to communicate with crossbar switches.

In one or more examples, the data de-interleaver 204 and data interleaver 212 uses cooperation from external devices, i.e. agents 208. Consider 32 agents 208, such as networking line card ASICs, GPUs, CPUs, or machine-learning accelerators, connected to a 128×128×256 two-way interleaved non-blocking crossbar switch. Each agent contributes 128/32=4 ports' worth of traffic to the switch in both directions. The output of each agent (connected to the switch ingress) 208 interleaves outgoing traffic. Likewise, the input of each agent (connected to the switch egress) 208 de-interleaves incoming traffic.

The degree of interleaving can be configurable on system boot-up. The main example in this disclosure describes two two-way interleaved 128×128×128 switches in the same device package operating in parallel as a one 128×128×256 non-blocking crossbar switch. By designing the multi-die switch to support both two-way and four-way interleaving ($Q \in \{2,4\}$), using two such multi-die devices can scale the aggregate non-blocking switching bandwidth to 256×256×256 when Q=4. In other words, the four semiconductor dice in the two packaged two-die devices work in parallel as four 256×256×64 switches. Switch architects need to decide on the number of configurations upfront. For example, a configuration could have $Q \in \{2,4,8,16\}$. The higher the degree of interleaving, the more switch select signals there are and the more interleaving configurations that data interleavers and de-interleavers support.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, a digital signal processor (DSP), an application specific integrated circuit (ASIC), or a processor (e.g., a general purpose or specifically programmed processor). Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein, for example, instructions for performing the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

While the foregoing is directed to specific examples, other and further examples may be devised without departing from the basic scope thereof, and the scope thereof is determined by the claims that follow.

What is claimed is:

1. A crossbar switch system comprising:
   a plurality of semiconductor dice;
   one or more data interleavers coupled to a crossbar switch, wherein each data interleaver of the one or more data interleavers includes a plurality of input ports;
   one or more data de-interleavers coupled to the crossbar switch, wherein each data de-interleaver of the one or more data de-interleavers includes a plurality of output ports; and
   a plurality of interleaved crossbar switch segments, wherein one crossbar switch segment of the plurality of interleaved crossbar switch segments is implemented on one semiconductor die of the plurality of semiconductor dice, and wherein any one output port of the plurality of output ports is configured to receive data from any one input port.

2. The crossbar switch system of claim 1, wherein no data connections are configured between the semiconductor dice.

3. The crossbar switch system of claim 1, wherein the one or more data interleavers are coupled to transmitters.

4. The crossbar switch system of claim 1, wherein the one or more data de-interleavers are coupled to receivers.

5. The crossbar switch system of claim 1, wherein the plurality of interleaved crossbar switch segments includes a total of Q crossbar switch segments, and wherein T is a total bandwidth, each crossbar switch segment of the plurality of interleaved crossbar switch segments is configured to switch a portion equal to T/Q of the total bandwidth.

6. The crossbar switch system of claim 1, further comprising a plurality of device packages.

7. The crossbar switch system of claim 1, wherein a degree of interleaving in the interleaved crossbar switch segments is configurable on system boot-up.

8. A crossbar switch system comprising:
   one or more data de-interleavers configured to receive data from a crossbar switch;
   an integrated circuit device coupled to the one or more data de-interleavers; and
   one or more data interleavers coupled to the integrated circuit device, wherein the one or more data interleavers are configured to transmit data to the crossbar switch.

9. The crossbar switch system of claim 8, wherein the one or more data de-interleavers and the one or more data interleavers are configured on a different semiconductor die than the integrated circuit device.

10. The crossbar switch system of claim 8, wherein the one or more data de-interleavers and the one or more data interleavers are configured on a separate device package than the integrated circuit device.

11. A method for implementing a crossbar switch, the method comprising:
    providing one or more device packages;
    providing a plurality of semiconductor dice;
    providing one or more data interleavers coupled to a crossbar switch, wherein each data interleaver of the one or more data interleavers includes a plurality of input ports;
    providing one or more data de-interleavers coupled to the crossbar switch, wherein each data de-interleaver of the one or more data de-interleavers includes a plurality of output ports; and
    providing a plurality of interleaved crossbar switch segments, wherein one crossbar switch segment of the plurality of interleaved crossbar switch segments is implemented on one semiconductor die of the plurality of semiconductor dice,
    wherein no data connections are configured between the semiconductor dice, and wherein any one output port is configured to receive data from any one input port.

12. The method of claim 11, wherein the one or more data interleavers are coupled to transmitters.

13. The method of claim 11, wherein the one or more data de-interleavers further comprise receivers.

14. The method of claim 11, wherein the plurality of interleaved crossbar switch segments comprises Q crossbar switch segments, wherein T is a total bandwidth, and wherein each crossbar switch segment is configured to switch a portion of the data equal to T/Q of the total bandwidth.

15. The method of claim 11, wherein a degree of interleaving in the interleaved crossbar switch segments is configurable on system boot-up.

16. The method of claim 11, wherein the one or more data de-interleavers and the one or more data interleavers are configured on a same semiconductor die of the plurality of semiconductor dice.

17. The method of claim 11, wherein the one or more data de-interleavers and the one or more data interleavers are configured on separate semiconductor dice of the plurality of semiconductor dice.

18. The method of claim 11, wherein the one or more data de-interleavers and the one or more data interleavers are configured on one device package.

19. The method of claim 11, wherein the one or more data de-interleavers and the one or more data interleavers are configured on separate device packages.

20. The method of claim 11, wherein the plurality of semiconductor dice are configured on one device package.

* * * * *